United States Patent [19]
Mametani

[11] Patent Number: 5,289,422
[45] Date of Patent: Feb. 22, 1994

[54] SEMICONDUCTOR DEVICE HAVING DUMMY WIRING PATTERN THEREIN AND MANUFACTURING METHOD THEREOF

[75] Inventor: Tomoharu Mametani, Hyogo, Japan

[73] Assignee: Mitsubishi Denki Kabushiki Kaisha, Tokyo, Japan

[21] Appl. No.: 784,313

[22] Filed: Oct. 29, 1991

[30] Foreign Application Priority Data

Nov. 1, 1990 [JP] Japan .................................. 2-296233

[51] Int. Cl.⁵ .................... H01L 21/70; H01L 29/68
[52] U.S. Cl. .................................. 365/210; 365/185; 365/182
[58] Field of Search ...................... 365/210, 182, 185

[56] References Cited

U.S. PATENT DOCUMENTS

| 4,841,483 | 6/1989 | Furuyama ........................... 365/182 |
| 4,994,893 | 2/1991 | Ozaki et al. . | |

FOREIGN PATENT DOCUMENTS

| 0361121A2 | 4/1990 | European Pat. Off. . |
| 61-263130 | 11/1986 | Japan . |
| 62-57222 | 3/1987 | Japan . |
| 62-194628 | 8/1987 | Japan . |
| 1-186624 | 7/1989 | Japan . |
| 2-37725 | 2/1990 | Japan . |
| 2-94472 | 4/1990 | Japan . |
| WO90/03046 | 3/1990 | PCT Int'l Appl. . |
| 2156581A | 10/1985 | United Kingdom . |

OTHER PUBLICATIONS

Article entitled "The Loading Effect in Plasma Etching", by C. J. Magab, J. Electrochem. Soc, Solid-State Science and Technology, Aug. 1977.

Primary Examiner—Eugene R. LaRoche
Assistant Examiner—Viet Q. Nguyen
Attorney, Agent, or Firm—Lowe, Price, LeBlanc & Becker

[57] ABSTRACT

A are a semiconductor memory device excellent memory characteristics of which can be obtained without deteriorating a characteristic of a transistor for use in a peripheral circuit even when a memory cell array region and a peripheral circuit region differ from each other in wiring pattern density and a manufacturing method therefor. The semiconductor memory device includes a dummy pattern formed between and at predetermined distance from gate electrodes of a transfer gate transistor in the peripheral circuit region. As a result, precision in dimension of the gate electrode in the peripheral circuit portion is improved to achieve excellent memory characteristics without deteriorating the transistor

11 Claims, 8 Drawing Sheets

SEMICONDUCTOR DEVICE HAVING DUMMY WIRING PATTERN THEREIN AND MANUFACTURING METHOD THEREOF

BACKGROUND OF THE INVENTION

1. Field of the Invention

The present invention relates generally to semiconductor memory devices and a manufacturing method thereof, and more particularly, to semiconductor memory devices formed on semiconductor substrates having at least one memory cell array region at which a plurality of memory cells each comprising a transistor and a capacitor are formed and a peripheral circuit region at which a plurality of transistors for peripheral circuits are formed, and a method of manufacturing such semiconductor memory devices.

2. Description of the Background Art

In recent years, a remarkable spread of information apparatus such as computers has been increasing a demand for semiconductor memory devices. In particular, semiconductor memory devices having a large storage capacity and operable at a high speed are in great demand, which demand is followed by technological development to improve integration density, response and reliability of semiconductor memory devices.

Figure 4:
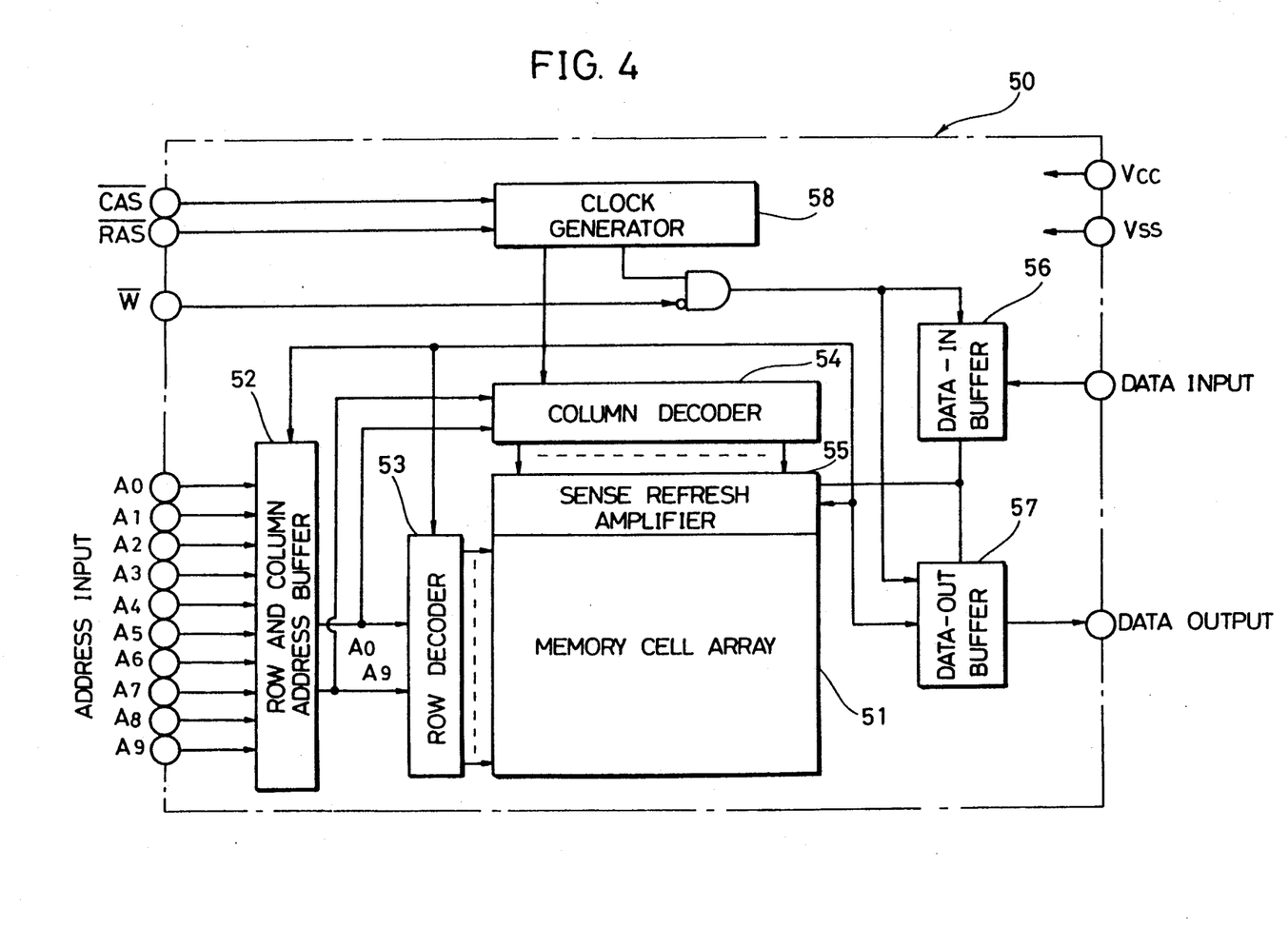
FIG. 4 is a block diagram showing an arrangement of a conventional common DRAM.

Out of semiconductor memory devices, a DRAM (Dynamic Random Access Memory) is well known as a memory which enables random input and output of storage information. A DRAM generally comprises a memory cell array portion serving as a storage region wherein a lot of storage information is stored and a peripheral circuit portion for inputting/outputting external signals. FIG. 4 is a block diagram showing an arrangement of a common DRAM. With reference to FIG. 4, a DRAM 50 comprises a memory cell array 51 for storing data signals of storage information, a row and column address buffer 52 for receiving external address signals for selecting memory cells constituting an unit storage circuit, a row decoder 53 and a column decoder 54 for designating a memory cell by decoding the address signals, a sense refresh amplifier 55 for amplifying the signal stored in the designated memory cell and reading the amplified signal, a data-in buffer 56 and data-out buffer 57 for inputting and outputting data, respectively, and a clock generator 58 for generating clock signals.

Memory cell array 51 occupying a large area of a semiconductor chip includes a plurality of memory cells for storing unit storage information arranged in a matrix. In general, as a memory cell, a one-transistor one-capacitor type memory cell is known which comprises one MOS transistor and one capacitor connected thereto. A memory cell of such simple arrangement enables an increase in integration of a memory cell array with ease, which fact leads to a wide use of such memory cell in a DRAM having a large capacity.

Memory cells for use in a DRAM fall into several types depending on capacitor arrangement. A stacked type capacitor, a main part of which extends above a gate electrode and a field isolating film, enables an increase in opposing areas of electrodes of the capacitor, thereby increasing a capacitance of the capacitor. The stacked type capacitor having such characteristic ensures a capacitor capacitance even when elements are made small in scale as an integration density of a semiconductor device is increased. As a result, an increase in integration density of a semiconductor memory device leads to a frequent use of a stacked type capacitor. Integration density of a semiconductor memory device has been further increased, which is followed by an improvement in a stacked type capacitor.

Figure 5:
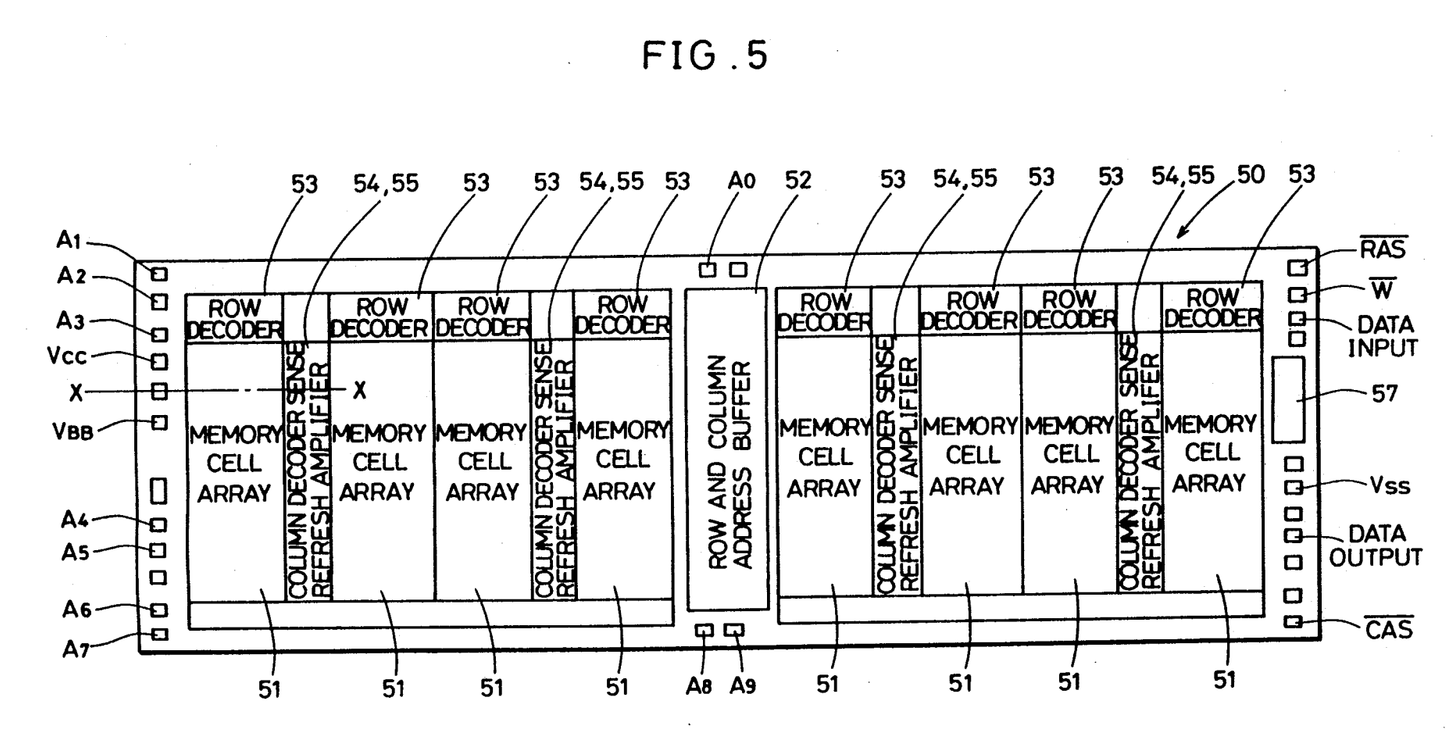
FIG. 5 is a diagram showing an arrangement of the respective components of the DRAM shown in FIG. 4.

FIG. 5 is a diagram showing an arrangement of the respective components of the DRAM shown in FIG. 4. With reference to FIG. 5, column decoder 54 and sense refresh amplifier 55 are laterally arranged adjacent to memory cell array 51. Raw decoder 53 is vertically arranged adjacent to memory cell array 51. A plurality of memory cell arrays 51 are arranged each having vertically disposed row decoder 53 and laterally disposed column decoder 54 and sense refresh amplifier 55. Memory cell array 51 comprises a plurality of memory cells (not shown) arranged corresponding to a storage capacity. Row and column address buffer 52 is vertically arranged at the center of DRAM 50. Input portions corresponding to address inputs $A_0$–$A_9$ are arranged surrounding the plurality of memory cell arrays 51. A data out buffer 57 and Vss connected to the outside of the DRAM are arranged at the opposite sides of the DRAM 50 in the vertical direction.

Figure 6:
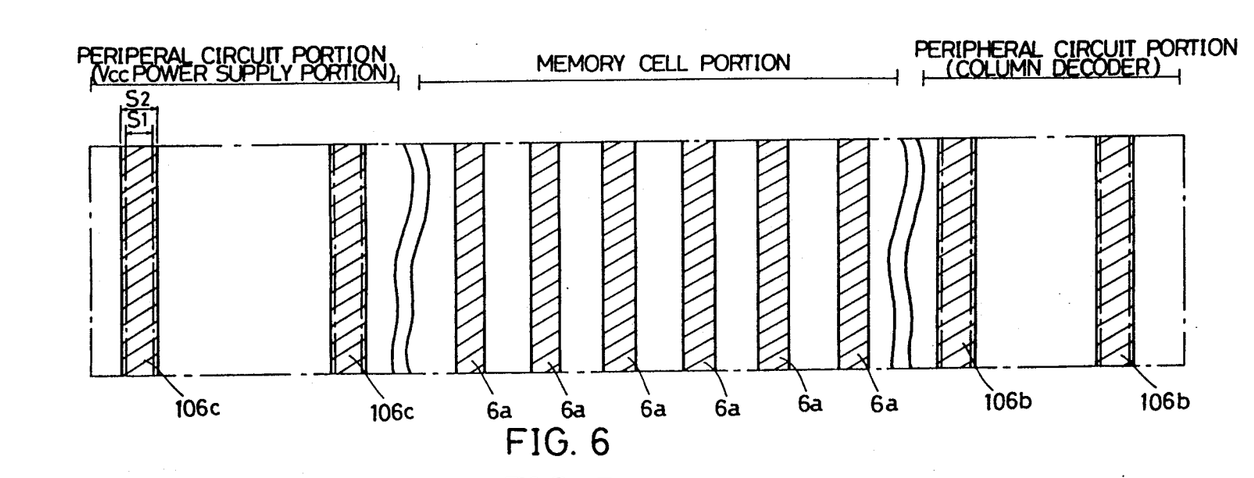
FIG. 6 is a plan view showing the wiring pattern of the DRAM taken along X—X shown in FIG. 5.
Figure 7:
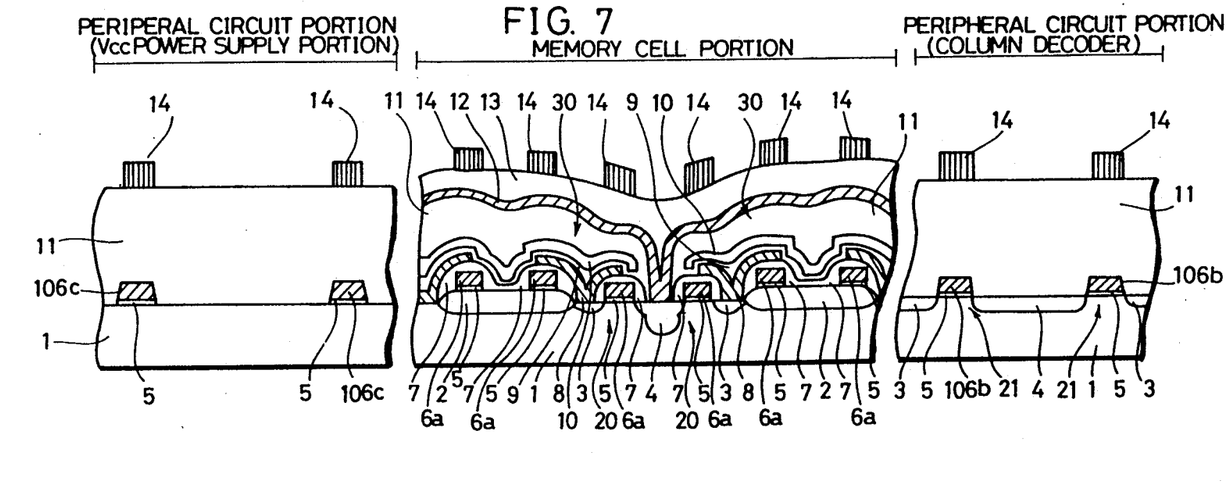
FIG. 7 is a sectional view showing the arrangement of the DRAM shown in FIG. 6.

FIG. 6 is a plan view showing a wiring pattern taken along X—X of the DRAM shown in FIG. 5 and FIG. 7 is a diagram showing the sectional arrangement of the DRAM shown in FIG. 6. With reference to FIG. 6, a peripheral circuit portion (Vcc power supply portion, column decoder) and a memory cell portion in a conventional DRAM differ in density of a formed wiring pattern. That is, while the wiring pattern is formed to have a high density in the memory cell portion, the pattern is formed to have a low density in the peripheral circuit portion. This is because integration of the memory cell portion is further increased to meet the requirement on an increase in storage capacity, while the peripheral circuit portion needs not to be so highly integrated as compared with the memory cell portion. With reference to FIGS. 6 and 7, a plurality of gate electrodes 6a of transfer gate transistors 20 each constituting one memory cell are arranged spaced apart from each other at predetermined intervals in the memory cell portion. Gate electrodes 106b of transfer gate transistors 21 are arranged in a column decoder region in the peripheral circuit portion at spacing larger than that of gate electrodes 6a in the memory cell portion. In a Vcc power supply portion in the peripheral circuit portion, wiring layers 106c are arranged at spacing larger than that of gate electrodes 6a in the memory cell portion.

An arrangement of a conventional DRAM will be described with reference to FIG. 7. The DRAM comprises a memory cell portion and a peripheral circuit portion. The memory cell portion includes a memory cell comprising one transfer gate transistor 20 and one capacitor 30, and a bit line 12 for transferring electric charges stored in the capacitor 30 of the memory cell.

Transfer gate transistor 20 constituting the memory cell comprises the above-described gate electrode 6a formed on an oxide film 5 formed on a semiconductor substrate 1, and impurity regions 3 and 4 formed at semiconductor substrate 1 at the opposite sides of gate electrode 6a.

Capacitor 30 comprises a storage node 8 electrically connected to one impurity region 3 of transfer gate transistor 20 and a cell plate 10 formed on storage node 8 with a dielectric film 9 provided therebetween. Bit line 12 is electrically connected to the other impurity region 4 of transfer gate transistor 20. A field insulation film 2 for isolating adjacent elements is formed at semiconductor substrate 1. Gate electrodes 6a are also formed spaced apart from each other at a predetermined distance on field insulation film 2 with oxide film 5 provided therebetween. An interlayer insulation film 11 is formed between cell plate 10 of capacitor 30 and bit line 12. An interlayer insulation film 7 is formed between storage node 8 and gate electrode 6a. An interlayer insulation film 13 is formed on bit line 12. Formed on interlayer insulation film 13 are aluminum wiring layers 14 at specific spacing to correspond to gate electrodes 6a.

The column decoder in the peripheral circuit portion includes two transfer gate transistors 21. Transfer gate transistor 21 comprises gate electrode 106b formed on oxide film 5 formed on semiconductor substrate 1 and impurity regions 3, 4 formed at semiconductor substrate 1 at the opposite sides of gate electrode 106b. Formed on transfer gate transistor 21 is interlayer insulation film 11 on which aluminum wirings 14 are formed to correspond to gate electrodes 106b.

The Vcc power supply portion in the peripheral circuit portion comprises wiring layers 106c connected to the power supply Vcc. Wiring layers 106c are arranged on oxide film 5 formed on semiconductor substrate 1 at specific spacing. Formed on wiring layers 106c is interlayer insulation film 11 on which aluminum wirings 14 are formed to correspond to wiring layers 106c.

For writing to a conventional DRAM having such arrangement, a column decoder in the peripheral circuit portion or the like first designates a memory cell. Then, signal charges are transmitted through bit line 12 to the designated memory cell. The signal charges transmitted through bit line 12 are transmitted to storage node 8 of capacitor 30 by applying predetermined charges to gate electrode 6a. The signal charges transmitted to storage node 8 are stored in capacitor 30. In a reading operation, signal charges are transmitted onto bit line 12 by applying a predetermined voltage to gate electrode 6a. The signal charges transmitted onto bit line 12 are externally read out through the column decoder (see FIG. 4).

Figure 8A:
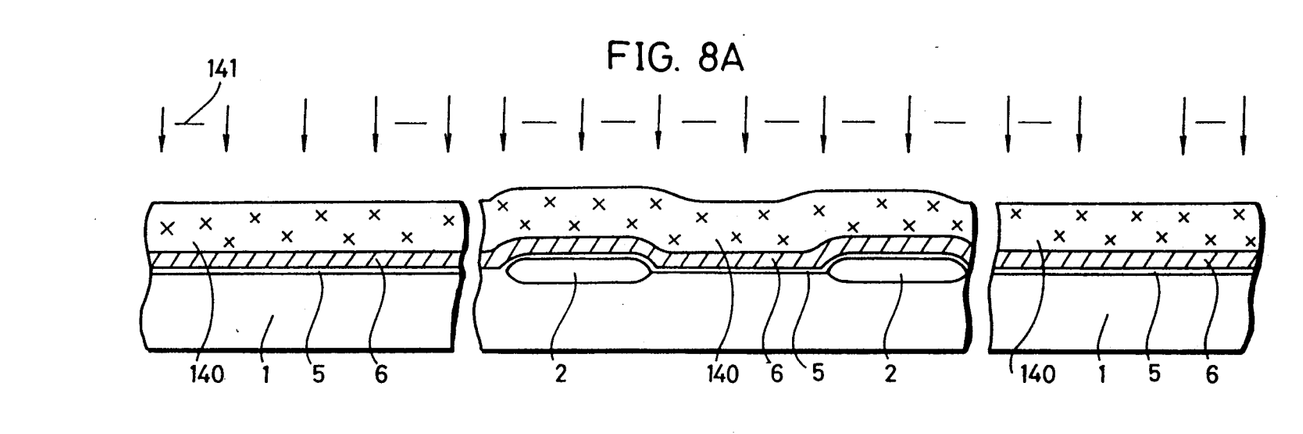
FIGS. 8A to 8D are sectional views explaining a process of forming the wiring pattern of the DRAM shown in FIG. 6.
Figure 8B:
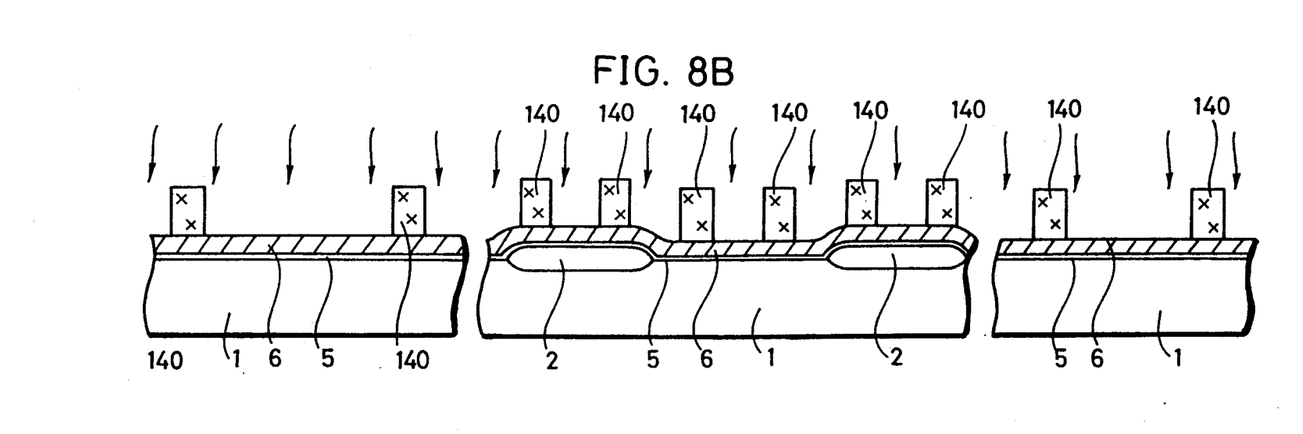
Figure 8C:
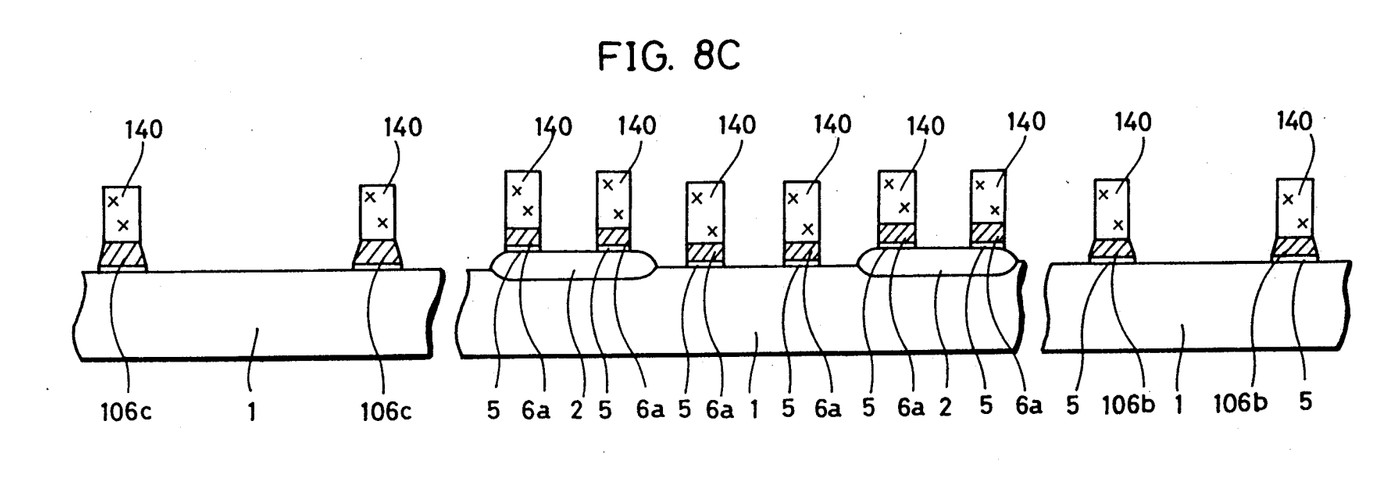
Figure 8D:
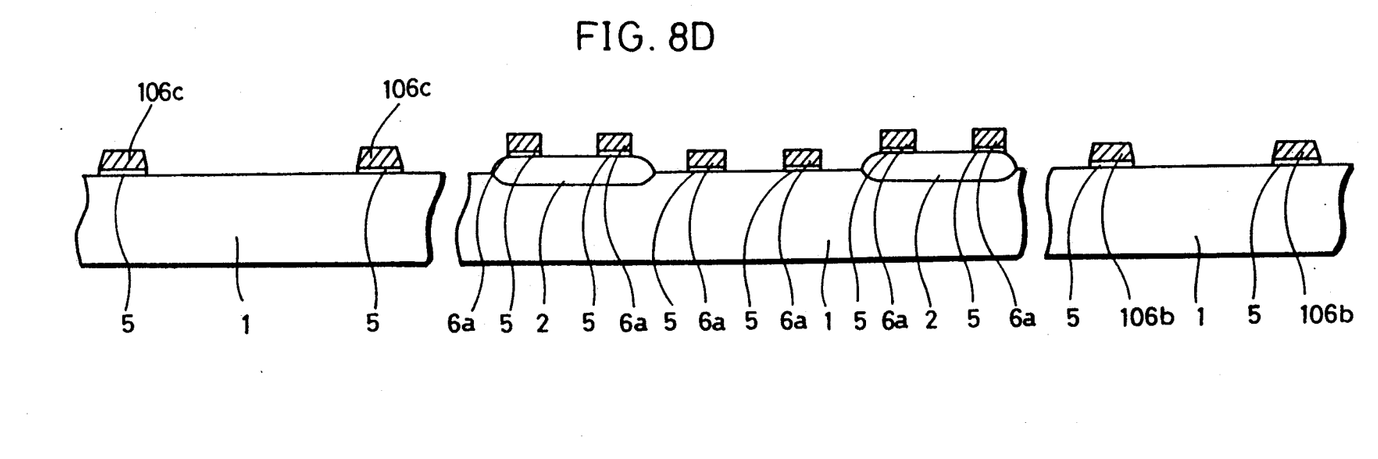

As described above, in the conventional DRAM having such arrangement and operation, the density of the wiring pattern formed in the memory cell portion is higher than that of the wiring pattern formed in the peripheral circuit portion. FIGS. 8A to 8D are sectional views explaining a process of forming a wiring pattern of the DRAM shown in FIG. 6. The process of forming a wiring pattern will be described with reference to FIGS. 8A to 8D. With reference to FIG. 8A, a field insulation film 2 is formed at a semiconductor substrate 1. An oxide film 5 is formed on semiconductor substrate 1 and field insulation film 2. Formed on oxide film 5 is a polysilicon layer 6 on which a resist 140 is applied, which is exposed by using a photomask 141 previously prepared corresponding to the wiring pattern. Thereafter, resist 140 at a region wherein no wiring pattern is formed is removed by a development processing. With reference to FIG. 8B, etching is carried out by using the remaining resist 140 as a mask. As a result, the wiring pattern as shown in FIG. 8C is formed. As shown in FIG. 8D, a removal of resist 140 obtains a predetermined wiring pattern. After such processes the DRAM as shown in FIG. 7 is completed through an ordinary process.

As described above, in a conventional DRAM, a density of a wiring pattern formed in a memory cell portion is higher than that of a wiring pattern formed in a peripheral circuit portion. In other words, the spacing between gate electrodes 6a formed in the memory cell portion is narrower than that between gate electrodes 106b formed in the peripheral circuit portion. In such a case as spacing between gate electrodes varies, the following problems arise on a manufacturing process.

More specifically, the peripheral circuit portion with large wiring spacing requires more development amount at the time of exposing and developing resist 140 as compared with the development amount in the memory cell portion. A large development amount makes in the final resist width larger than that with a less development amount. This is partly because a large development amount per unit area of the resist reduces a development density. For the similar reason, the etching amount at the time of formation of the wiring pattern is increased in the peripheral circuit portion having wide spacing between wirings and the width of the final wiring pattern is increased accordingly. These phenomenons are referred to as loading effect, which is disclosed in "SOLID-STATE SCIENCE AND TECHNOLOGY August 1977-The Loading Effect in Plasma Etching", for example.

In other words, in a conventional DRAM, a development amount of a resist and an etching amount of a polysilicon layer per unit area are larger in a peripheral circuit portion than in a memory cell portion at the time of forming wiring patterns, thereby making the final wiring patterns wider than that designed in advance. As described in the foregoing, a transistor characteristic is deteriorated when a wiring pattern using a planned width can not be obtained, which pattern uses, for example, gate electrode 106b constituting transfer gate transistor 21 of the peripheral circuit portion shown in FIG. 7. The deteriorated transistor characteristic of transfer gate transistor 21 in the peripheral circuit portion leads to deterioration in a memory characteristic. Reading and writing from/to the DRAM is carried out by using transfer gate transistor 21 of the peripheral circuit as described above. The deteriorated characteristic of transfer gate transistor 21 therefore prevents reliable reading and writing operation from/to the DRAM. As a result, the memory characteristic of the DRAM is deteriorated.

SUMMARY OF THE INVENTION

An object of the present invention is to obtain an excellent memory characteristic of a semiconductor memory device without deteriorating a transistor characteristic of a transistor for use in a peripheral circuit.

Another object of the present invention is to improve size precision of a gate electrode layer at a peripheral circuit region in a semiconductor memory device as compared with a conventional memory device.

A further object of the present invention is to improve size controllability of a memory cell portion and a peripheral circuit portion while uniforming precision in size thereof in a semiconductor memory device.

Still further object of the present invention is to form a dummy wiring layer in a method of manufacturing a semiconductor memory device without making a manufacturing process complicated.

According to one aspect of the present invention, a semiconductor memory device includes a pair of gate electrode layers formed in a memory cell array region and a gate electrode layer and a dummy wiring layer formed in a peripheral circuit region. The paired gate electrode layers formed in the memory cell array region are arranged in parallel and at a predetermined distance from each other to constitute a transistor. The gate electrode layer and the dummy wiring layer formed in the peripheral circuit region are arranged in parallel and at a predetermined distance from each other and the gate electrode layer constitutes a transistor for use in the peripheral circuit. The pair of gate electrode layers formed in the memory cell array region are arranged to have spacing thereof approximately as wide as spacing between the gate electrode layer and the dummy wiring layer formed in the peripheral circuit region.

In operation, development amounts and etching amounts of a resist per unit area are uniformed in the memory cell array region and in the peripheral circuit region at the time of forming the gate electrode layers of the memory cell array region and in the peripheral circuit region because the pair of gate electrode layers formed at the memory cell array region is arranged to have spacing thereof approximately as wide as that between the gate electrode layer and the dummy wiring layer formed at the peripheral circuit region. As a result, precisions in size of the gate electrode layers formed in the memory cell array region and the peripheral circuit region are uniformed and precision in size of the gate electrode layer at the peripheral circuit region can be improved as compared with a conventional device.

According to another aspect of the present invention, the method of manufacturing a semiconductor memory device includes a step of forming a conductive layer on a semiconductor substrate and a resist on the conductive layer. Then, the resist is removed to leave portions of the resist on the conductive layer which portions serve as gate electrode layers constituting transistors and peripheral circuit transistors and leave portions of the resist on the conductive layer which portions serve as dummy wiring layers formed at a predetermined distance from gate electrodes in the peripheral circuit region. Thereafter, the conductive layer is patterned by etching by using the remaining resist as a mask. Then, the remaining resist is removed.

In operation, since the resist is removed to leave portions of the resist on the conductive layer which portions serve as gate electrode layers constituting transistors and peripheral circuit transistors and leave portions of the resist on the conductive layer which portions serve as dummy wiring layers formed at a predetermined distance from gate electrode layers in the peripheral circuit region, development amounts and etching amounts of a resist are uniformed in the memory cell array region and in the peripheral circuit region at the time of forming the gate electrode layers of the memory cell array region and the peripheral circuit region. As a result, the gate electrode layers of the memory cell array region and the peripheral circuit region are formed under the same conditions and the gate electrode layer of the peripheral circuit region can be formed to have precision in size higher that of a conventional device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the drawings.

Figure 1:
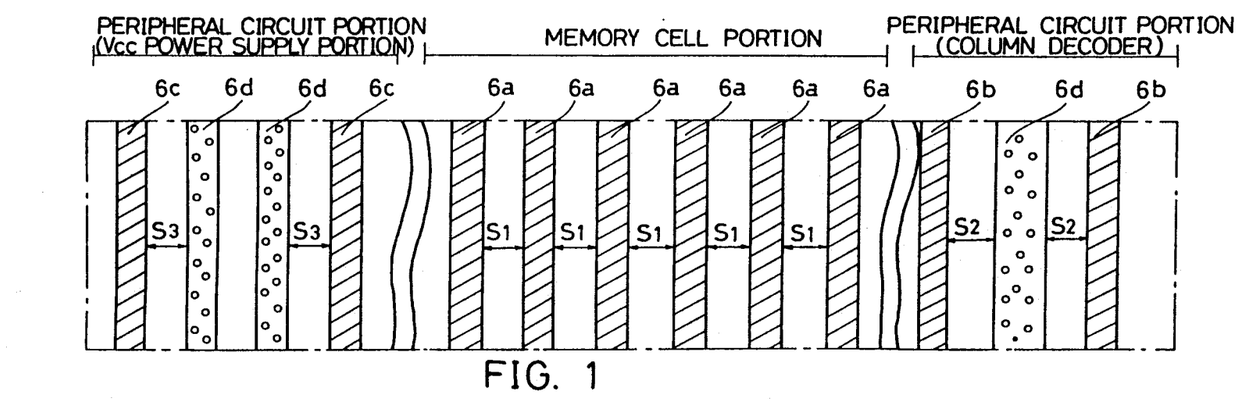
FIG. 1 is a plan view showing a wiring pattern of a DRAM according to one embodiment of the present invention.
Figure 2:
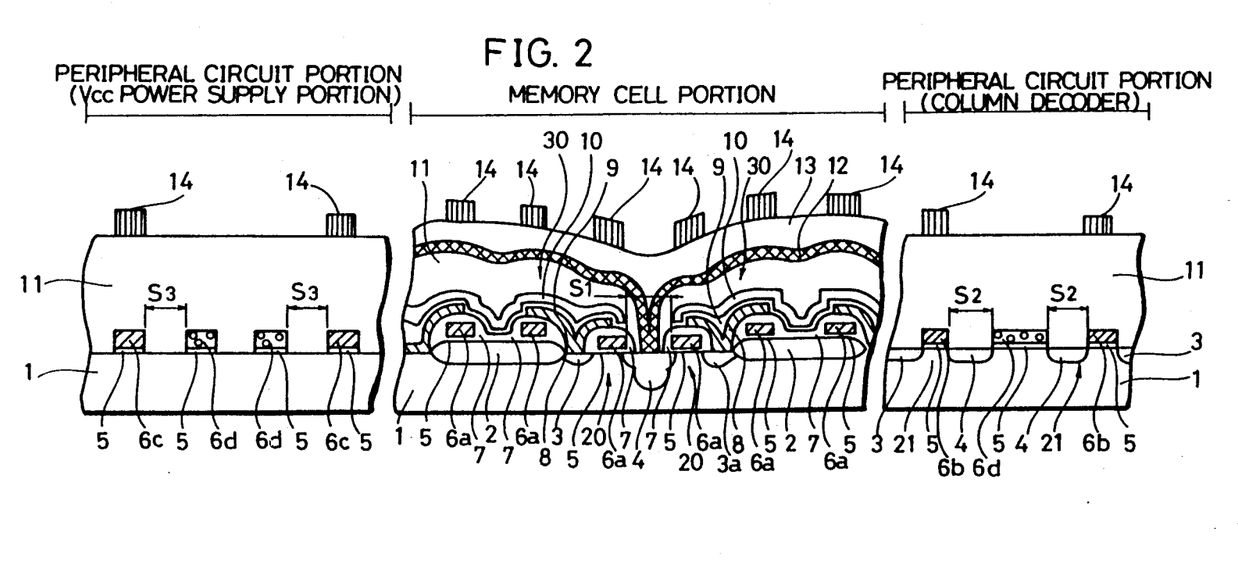
FIG. 2 is a sectional view showing the arrangement of the DRAM shown in FIG. 1.

FIG. 1 is a plan view showing a wiring pattern of a DRAM according to one embodiment of the present invention and FIG. 2 is a sectional view showing the arrangement of the DRAM shown in FIG. 1. With reference to FIGS. 1 and 2, the DRAM according to the present embodiment comprises a memory cell portion and a peripheral circuit portion like a conventional DRAM. The memory cell portion is the same as that of the conventional DRAM shown in FIG. 7 and no description thereof will be therefore made.

A column decoder in the peripheral circuit portion includes transfer gate transistors 21 arranged at predetermined distance from each other on a semiconductor substrate 1. Transfer gate transistor 21 comprises a gate electrode 6b formed on an oxide film 5 disposed on semiconductor substrate 1 and impurity regions 3, 4 formed at semiconductor substrate 1 at the opposite sides of gate electrode 6b. The column decoder further includes a dummy pattern 6d formed between gate electrodes 6b at predetermined distance therefrom, an interlayer insulation film 11 formed on transfer gate transistor 21 and dummy pattern 6d, and aluminum wirings 14 formed on interlayer insulation film 11 to correspond to gate electrodes 6b.

A Vcc power supply portion in the peripheral circuit portion includes wiring layers 6c connected to a power supply Vcc. Wiring layers 6c are arranged at predetermined distance from each other on oxide film 5 formed on semiconductor substrate 1. Power supply portion Vcc further includes two dummy patterns 6d arranged at predetermined distance from and between wiring layers 6c, an interlayer insulation film 11 formed on wiring layers 6c and dummy patterns 6d, and aluminum wirings 14 formed on interlayer insulation film 11 to correspond to wiring layers 6c. Spacing $S_2$ between the gate electrode 6b and dummy pattern 6d of the column decoder is set to be approximately equal to spacing $S_1$ between gate electrodes 6a in the memory cell portion. Spacing $S_1$ between wiring layer 6c and dummy pattern 6d in the power supply portion Vcc is also set to be approximately equal to spacing $S_1$ between gate electrodes 6a in the memory cell portion.

As described in the foregoing, density (spacing) of a wiring pattern in the peripheral circuit portion is made approximately the same as that in the memory cell portion in the present embodiment by forming dummy pattern 6d in a region at which spacing between the wirings in the peripheral circuit portion is wide. As a result, the loading effect at the time of photolithography or etching, which prevents portions from being etched to have the same dimension and which is one of the conventional problems, can be avoided. In addition, the improved size precision at the peripheral circuit portion enables gate electrode 6b to be formed to have a dimension approximate to a designed value without deteriorating a transistor characteristic. As a result, more excellent memory characteristic can be obtained as compared with that of a conventional device. Furthermore, since precision in size is equal in the memory cell portion and in the peripheral circuit portion, size controllability can be improved in the DRAM as a whole.

Figure 3A:
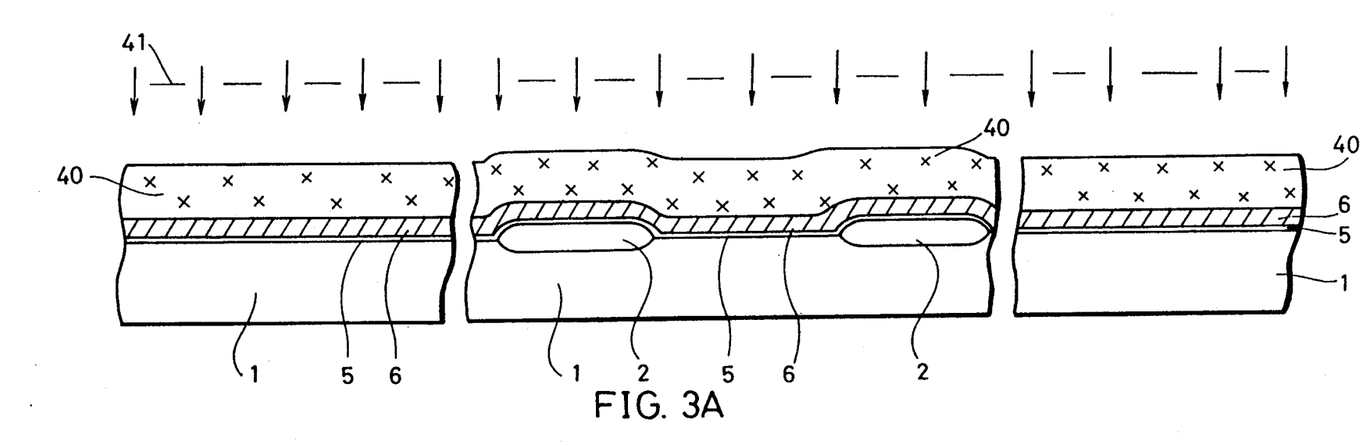
FIGS. 3A to 3D are sectional views explaining a process of forming the wiring pattern of the DRAM shown in FIG. 1.
Figure 3B:
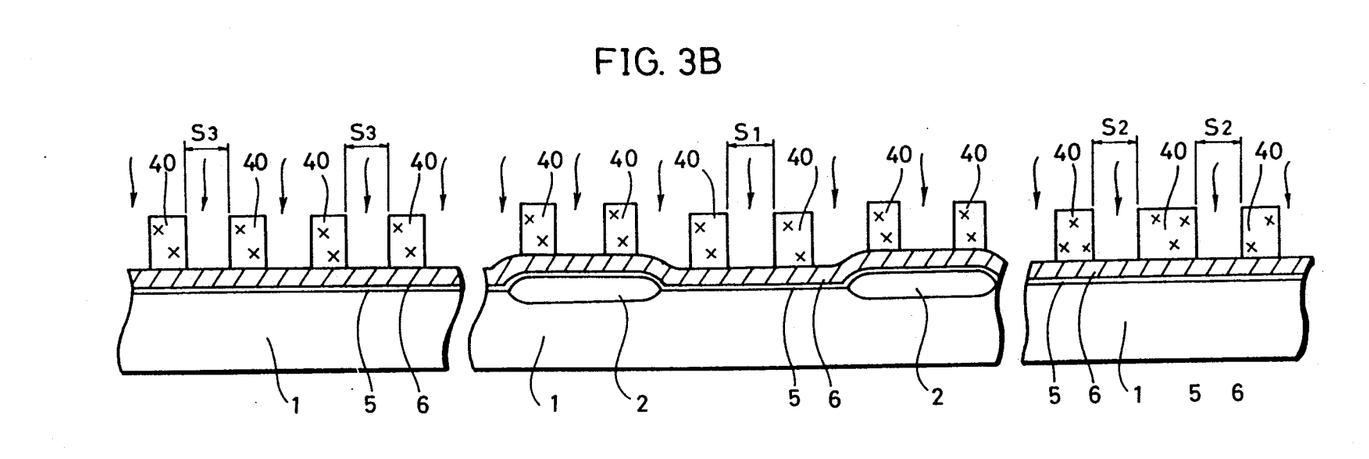
Figure 3C:
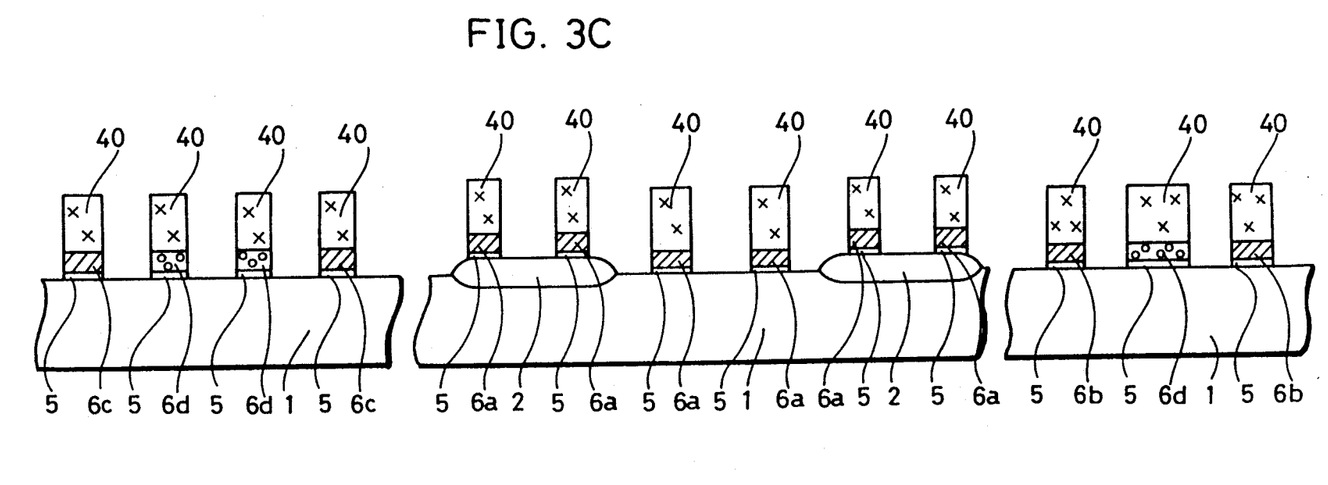
Figure 3D:
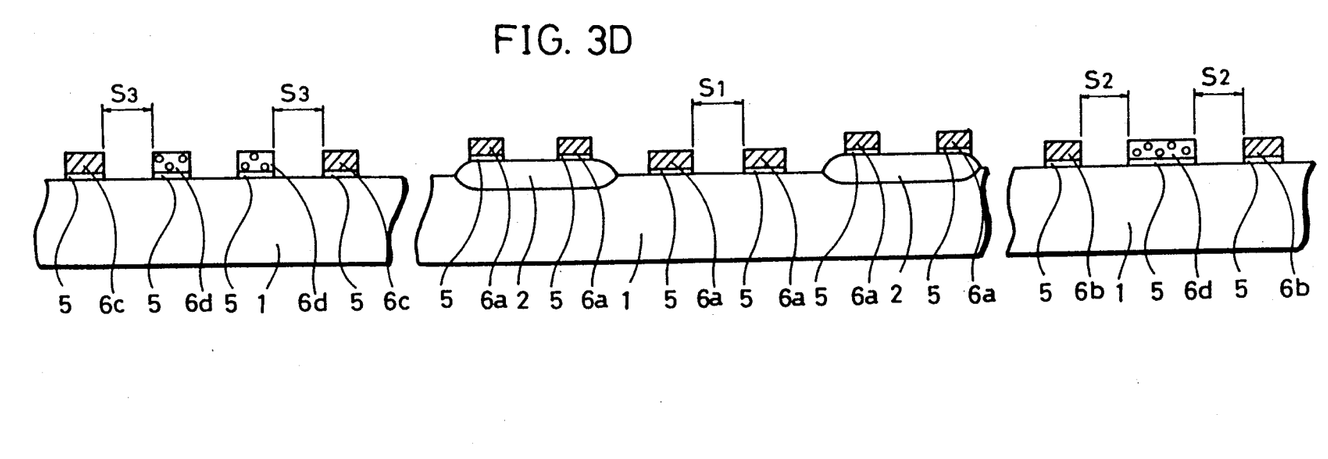

FIGS. 3A to 3D are sectional views explaining a process of forming the wiring pattern of the DRAM shown in FIG. 1. With reference to FIGS. 3A to 3D, a process of forming the wiring pattern will be described. First, with reference to FIG. 3A, field insulation films 2 for isolating elements are formed at semiconductor substrate 1. Oxide film 5 is formed on field insulation film 2 and semiconductor substrate 1. A polysilicon layer 6 is formed on oxide film 5. A resist 40 is applied on polysilicon layer 6. Resist 40 is exposed to light by using a photomask 41 previously designed to form a dummy pattern. Then, as shown in FIG. 3B, resist 40 is patterned by a development processing. More specifically, resists 40 are patterned such that spacing $S_1$ between resists 40 in the memory cell portion and spacings $S_2$ and $S_3$ between resists 40 in the peripheral circuit portion are equal to each other. Etching is carried out by using resist 40 as a mask. As a result, such wiring pattern form as shown in FIG. 3C is obtained. Thereafter, as shown in FIG. 3D, resist 40 is removed to obtain a predetermined pattern. As described in the foregoing, the present embodiment enables dummy pattern 6d to be formed without adding steps of the same process for forming a wiring pattern as a conventional formation process, thereby preventing a manufacturing step from becoming complicated. In addition, the provision of dummy pattern 6d improves precision in size of gate electrode 6b and wiring layer 6c as compared with that in a conventional device. As a result, it is possible to obtain a wiring pattern of a desired size both in a memory cell portion and a peripheral circuit portion, thereby achieving a DRAM of high precision and high quality.

As described in the foregoing, in a semiconductor memory device according to the present invention which is manufactured to have spacing between a pair of gate electrodes formed in a memory cell array region approximately the same as spacing between a gate electrode layer and a dummy wiring layer formed in a peripheral circuit region, a development amount and an etching amount of a resist per unit area in the memory cell array region is made equal to those of the peripheral circuit region at the time of forming the gate electrode layers of the memory cell array region and the peripheral circuit region. As a result, precision in size of the gate electrode layers are uniformed both in the memory cell array region and the peripheral circuit region, while the precision in size of the gate electrode layer in the peripheral circuit region is improved as compared with that of a conventional device. Therefore, even when the gate electrode layers formed in the memory cell array region and the peripheral circuit region are different from each other in wiring density, excellent memory characteristic can be obtained without deteriorating the transistor characteristic of the transistor for use in the peripheral circuit.

In the method of manufacturing a semiconductor memory device according to the present invention, resist is removed to leave portions of the resist on conductive layer which portions serve as gate electrode layers constituting transistors and peripheral circuit transistors and portions of the resist on the conductive layer which portions serve as dummy wiring layers formed at a predetermined distance from the gate electrode layers in the peripheral circuit region, resulting in uniformed development amounts and etching amounts of a resist in the memory cell region and in the peripheral circuit region at the time of forming gate electrode layers therein. As a result, the gate electrode layers are formed, under the same conditions, in the memory cell array region and in the peripheral circuit region and the gate electrode layers in the peripheral circuit region can be formed to have size precision higher than that in a conventional device. Therefore, even if densities of the gate electrode layers formed in the memory cell array region and the periphery circuit region are different from each other, it is possible to obtain excellent memory characteristics without deteriorating the transistor characteristic of the transistor for use in the peripheral circuit. In addition, a semiconductor memory device of high precision in size can be manufactured without making a conventional manufacturing process complicated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate having at least one memory cell array region wherein a plurality of memory cells each including a first transistor and a capacitor are formed and a peripheral circuit region wherein a plurality of second transistors for use in a peripheral circuit are formed, said semiconductor memory device comprising:
    a pair of first gate electrode layers arranged in parallel and at predetermined distance from each other in said memory cell array region, each pair constituting said first transistor,
    a second gate electrode layer and a dummy wiring layer arranged in parallel and at predetermined distance from each other in said peripheral circuit region to constitute one of said second transistors for use in a peripheral circuit, wherein
    spacing between said paired first gate electrode layers formed in said memory cell array region is approximately the same as spacing between the second gate electrode layer and the dummy wiring layer formed in said peripheral circuit region.

2. The semiconductor memory device according to claim 1, wherein said dummy wiring layer includes a dummy wiring layer arranged in parallel to and at predetermined distance from a wiring layer formed in said peripheral circuit region.

3. The semiconductor memory device according to claim 1, wherein each of said first gate electrode layers formed in said memory cell array region, and said second gate electrode layer and said dummy wiring layer formed in said peripheral circuit region are made of the same material.

4. The semiconductor memory device according to claim 2, wherein each of said first gate electrode layers formed in said memory call array region, and said second gate electrode layer and said dummy wiring layer formed in said peripheral circuit region are made of the same material.

5. The semiconductor memory device according to claim 1, wherein
said first transistor formed in said memory cell array region includes impurity regions located at said semiconductor substrate at the opposite sides of each of said first gate electrode layers, and
each of said second transistors for use in the peripheral circuit formed in said peripheral circuit region includes impurity regions located at said semiconductor substrate at the opposite sides of said second gate electrode layer.

6. The semiconductor memory device according to claim 5, wherein said impurity region of each of said second transistors formed in said peripheral circuit region is located between said second gate electrode layer and said dummy wiring layer.

7. The semiconductor device according to claim 1, wherein each of said first gate electrode layers formed in said memory cell array region, and said second gate electrode layer and said dummy wiring layer formed in said peripheral circuit region are arranged on said semiconductor substrate with an insulation film provided therebetween.

8. The semiconductor memory device according to claim 2, wherein each of said first gate electrode layers formed in said memory cell array region, and said second gate electrode layer and said dummy wiring layer formed in said peripheral circuit region are arranged on said semiconductor substrate with an insulation film provided therebetween.

9. The semiconductor memory device according to claim 1, wherein said first gate electrode layers formed in said memory cell array region are approximately the same in wiring density as said second gate electrode layer and said dummy wiring layer formed in said peripheral circuit region.

10. The semiconductor memory device according to claim 2, wherein said first gate electrode layers formed in said memory cell array region are approximately the same in wiring density as said second gate electrode layer and said dummy wiring layer formed in said peripheral circuit region.

11. The semiconductor memory device according to claim 5, wherein one impurity region of the first transistor formed in said memory cell array region is connected to a lower electrode of the capacitor and the other impurity region is connected to a bit line.

* * * * *